(12) United States Patent
Singidi et al.

(10) Patent No.: US 11,698,832 B2
(45) Date of Patent: **\*Jul. 11, 2023**

(54) SELECTIVE SAMPLING OF A DATA UNIT DURING A PROGRAM ERASE CYCLE BASED ON ERROR RATE CHANGE PATTERNS

(71) Applicant: MICRON TECHNOLOGY, INC., Boise, ID (US)

(72) Inventors: Harish R Singidi, Fremont, CA (US); Ashutosh Malshe, Fremont, CA (US); Vamsi Pavan Rayaprolu, San Jose, CA (US); Kishore Kumar Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 43 days.

This patent is subject to a terminal disclaimer.

(21) Appl. No.: 17/461,918

(22) Filed: Aug. 30, 2021

(65) Prior Publication Data

US 2021/0390016 A1    Dec. 16, 2021

Related U.S. Application Data

(63) Continuation of application No. 16/862,446, filed on Apr. 29, 2020, now Pat. No. 11,106,532.

(51) Int. Cl.
| | |
|---|---|
| *G06F 11/00* | (2006.01) |
| *G06F 11/10* | (2006.01) |
| *G06F 11/07* | (2006.01) |
| *G06F 12/0882* | (2016.01) |
| *G06F 11/30* | (2006.01) |
| *G06F 12/02* | (2006.01) |

(52) U.S. Cl.
CPC ........ *G06F 11/1068* (2013.01); *G06F 11/076* (2013.01); *G06F 11/0793* (2013.01); *G06F 11/3037* (2013.01); *G06F 12/0246* (2013.01); *G06F 12/0882* (2013.01)

(58) Field of Classification Search
CPC ............... G06F 11/1068; G06F 11/017; G06F 11/0793; G06F 11/3037; G06F 12/0246; G06F 12/0882
See application file for complete search history.

(56) References Cited

U.S. PATENT DOCUMENTS

| | | |
|---|---|---|
| 2013/0176784 A1 | 7/2013 | Cometti et al. |
| 2016/0098216 A1 | 4/2016 | Huang et al. |
| 2017/0242747 A1* | 8/2017 | He ..................... G06F 11/1068 |
| 2019/0391746 A1 | 12/2019 | Papandreou et al. |
| 2020/0365228 A1* | 11/2020 | Cadloni ................ G06F 11/108 |
| 2022/0137842 A1* | 5/2022 | Hung .................... G06F 3/0679 |
| | | 711/166 |

\* cited by examiner

*Primary Examiner* — Christine T. Tu
(74) *Attorney, Agent, or Firm* — Lowenstein Sandler LLP

(57) ABSTRACT

A processing device, operatively coupled with the memory device, is configured to determine a first error rate associated a first set of pages of a plurality of pages of a data unit of a memory device, and a second error rate associated with a second set of pages of the plurality of pages of the data unit, determine a first pattern of error rate change for the data unit based on the first error rate and the second error rate, and responsive to determining that the first pattern of error rate change corresponds to a predetermined second pattern of error rate change, perform an action pertaining to defect remediation with respect to the data unit.

20 Claims, 7 Drawing Sheets

RBER change pattern graph 220

RBER change pattern graph 210

US 11,698,832 B2

SELECTIVE SAMPLING OF A DATA UNIT DURING A PROGRAM ERASE CYCLE BASED ON ERROR RATE CHANGE PATTERNS

RELATED APPLICATIONS

This application is a continuation application of co-pending U.S. patent application Ser. No. 16/862,446, filed Apr. 29, 2020, which is herein incorporated by reference.

TECHNICAL FIELD

The present disclosure generally relates to memory sub-systems, and more specifically, relates to selective sampling of a data unit during a program erase cycle based on error rate change patterns.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
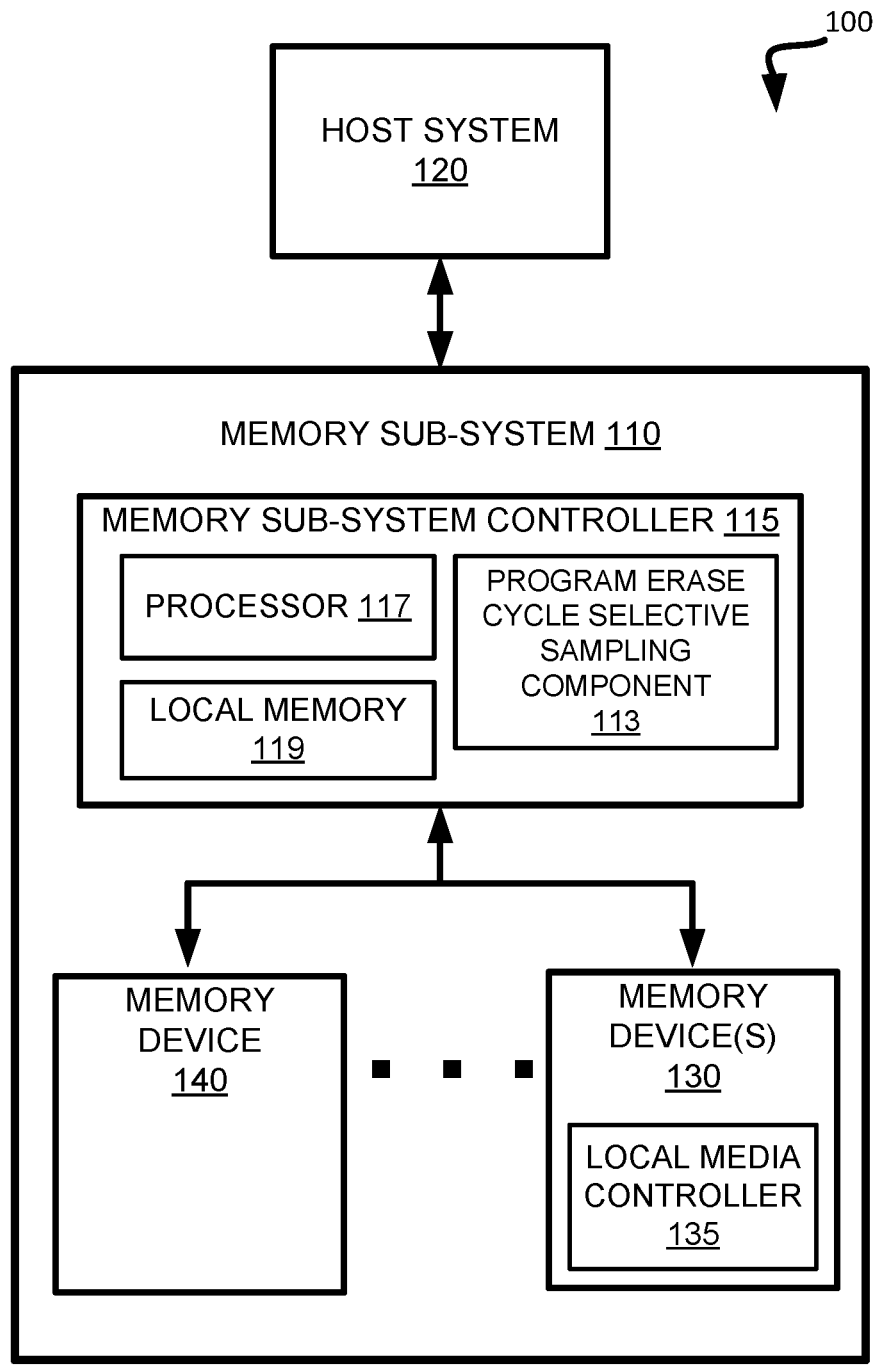
FIG. 1 illustrates an example computing system for supporting selective sampling of a data unit during a program erase cycle based on error rate change patterns, in accordance with some embodiments of the present disclosure.

Aspects of the present disclosure are directed to supporting selective sampling of a data unit during a program erase cycle (PEC), based on error rate change patterns in memory devices of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices that store data. The host system can provide data to be stored at the memory sub-system and can request data to be retrieved from the memory sub-system.

A memory sub-system can include multiple memory devices that can store data from a host system. A memory device can be a non-volatile memory device. A non-volatile memory device is a package of one or more dies. One example of non-volatile memory devices is a negative-and (NAND) memory device. Other examples of non-volatile memory devices are described below in conjunction with FIG. 1. The dies in the packages can be assigned to one or more channels for communicating with a memory sub-system controller. Each die can consist of one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. A data unit can be the entire memory sub-system, a die of memory component, a collection of codewords, a collection of memory pages, a collection of memory blocks, or any other meaningful portion of the memory sub-system.

As data gets written to a memory cell of the memory device for storage, the memory cell, with time, can deteriorate and can eventually become defective. For example, when too many read and write operations are performed on a memory cell, data stored at the memory cell and adjacent memory cells of the memory component can become corrupted or incorrectly stored at the memory cell. Additionally, many memory sub-systems support a redundancy mechanism to protect the host data against a failure of a portion of a memory device that is storing the host data. For example, for a negative-and (NAND) type flash memory device, the memory sub-system can implement a redundant array of independent NAND (RAIN) operation to provide redundancy for the data stored on the memory sub-system. As an example, the memory sub-system can generate parity data when writing data received from the host system to the memory sub-system to be able to reconstruct or recalculate the host data in the event of a failure of the portion of the memory device that is storing data from the host system. This parity data is temporarily stored at a certain location of the memory sub-system, such that it can be released when the corresponding pages of memory are to be free from reliability issues or likelihood of defects. Therefore, in order to be able to release parity data and to detect a potential occurrence of a defect before a data loss is caused by the defect, the memory sub-system performs operations to detect the likelihood of the occurrence of a defect at data units of the memory devices by frequently scanning the data units of the memory sub-system.

Many defects of the data units can result in a higher error rate when reading the data stored at the data units, thus the read error rate can be used as an indicator of the health of the data unit and can be determined during the execution of a data integrity check (also referred to herein as a "scan") to verify that the data stored at each data unit does not include errors. Therefore, a scanning mechanism that can ensure there is adequate sampling of memory cells across all data units can be preferred. However, the scanning operation for data integrity checks is costly and can introduce latency due to the read operations, repeated error detection, and correction operations that take place during a scan operation. As an example, for a given data unit, if every page is scanned and then possibly exposed to a correction operation (error control operation), this process can result in a reduction of the performance of a memory sub-system. Furthermore, as more resources of the memory sub-system are used to perform the error control operations, fewer resources are available to perform other read operations or write operations. Therefore, scanning operation coverage (which pages to scan) and frequency (how often to run a scan) can be tuned to minimize latency and performance penalties.

Common scanning practices include performing a scan operation of all pages of a data unit upon performing a program erase cycle (PEC) operation on the data unit. Based on the scan results of every page of the data unit, error detection and correction mechanisms can be applied to the data unit and parity data can further be released for the pages that are determined to be healthy. While this approach provides ultimate coverage for error detection, the scanning process in this case is largely time and bandwidth consuming, as it requires every page of the memory device to be scanned within a few PEC operations, thereby negatively affecting performance and increasing latency.

Aspects of the present disclosure address the above and other deficiencies by providing selective sampling of data units in a memory device based on a pattern of error rate change of scanned pages of the data units. In implementations, upon performing a PEC on a data unit of a memory device, a scan operation on a subset of pages of the data unit can be performed, in order to reduce the overhead of the scan operation on the performance of the memory device. In certain implementations, the subset of pages can be determined based on the location of the pages within the data unit. For example, pages that are located at uniform intervals within the data unit can be selected for scanning during a particular PEC, starting at a given starting page. During the next PEC, the starting page for selecting the subset of pages for scanning can be shifted by an offset from the starting page for selecting the sample pages during the previous PEC, and so on. By shifting the starting page and keeping the uniform interval for selecting pages for scanning, a different set of pages can be scanned at each PEC operation until the whole data unit is scanned. When all pages of the data unit are scanned, the offset can be reset to zero during the next PEC and the selection process for the subset of pages to be scanned can start at the first page of the data unit.

In implementations, a subset of the pages of the data unit can be scanned by performing read operations on the subset of pages, and a raw bit error rate (RBER) can be determined based on the read operation. The RBER can be used as a reliability metric of the read operation. In one implementation, an average RBER corresponding to the scanned set of pages at a particular PEC can be determined and tracked to monitor the health of the data unit. In implementations, the average RBER value determined at each PEC performed on the data unit can be stored at a storage location in order to track a pattern of change of the average RBER of the data unit over time. In certain implementations, the pattern of RBER change can be compared with a certain predetermined pattern RBER change that is recognized as indicative of the existence of one or more defects in a data unit. For example, based on historical data that is collected from scanning one or more data units over time, the memory sub-system can recognize a certain pattern of RBER change as a pattern of a defective data unit. Based on the comparison, if the two patterns are similar (e.g., match), the memory sub-system can determine that the data unit is likely to have one or more defects and can perform one or more actions to protect host data stored at the data unit before a failure of the data unit occur.

In certain implementations, when the memory sub-system determines that the pattern of RBER change of the data unit corresponds to (e.g., matches) the predetermined pattern of RBER change that is indicative of a defect, the memory sub-system can retire the data unit by moving the data stored at the data unit to another data unit of the memory sub-system and refraining from storing host data at the data unit. Alternatively, the memory sub-system can decide to monitor the data unit more closely for other indications of defects, instead of retiring the data unit, by increasing the number of pages scanned with each PEC, as an example.

On the other hand, when the memory sub-system determines that the pattern of RBER change of the data unit does not correspond to the predetermined pattern of RBER change that is indicative of a defect, the memory sub-system can store the current average RBER at a storage location so that it can be used in determining a pattern of RBER change over time. In certain implementations, the memory sub-system can also release parity data associated with the set of pages that were scanned to generate the current average RBER. Parity data can be stored temporarily to recover host data in case of a data loss caused by a defect. Parity data can be generated based on an exclusive-or (XOR) operation with the received host data and can then be used to reconstruct or recalculate the host data in the event of a failure of the portion of the memory device that is storing data from the host system. In implementations, when a set of pages of the memory device are deemed not defective (e.g., by scanning the set of pages and determining that RBER of the pages is within acceptable limits), the memory sub-system can release the parity data associated with the set of pages.

The techniques of supporting selective scanning of pages of a data unit during a PEC operation in a memory sub-system described herein enables an improved overall performance of the memory sub-system. Performing health checks in memory devices, e.g., by scanning the data units of the memory devices, introduces performance penalty as the bandwidth of the memory sub-system is at least partially consumed in executing the scan operations. Therefore, by scanning only a subset of the pages in each data unit, the time consumed in performing the scan operations can be reduced significantly. Additionally, because the set of pages of the data unit that are selected to be scanned differ with each PEC operation, the health check coverage of the data unit is not compromised because every page of the data unit is eventually scanned within a limited number of PEC operations of the data unit. Therefore, the techniques described herein of supporting selective sample of data units during a PEC based on error rate change patterns reduce the overhead of scanning every page of the data unit at each PEC operation, which reduces latency and improves the overall performance of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A 3D cross-point memory device is a cross-point array of non-volatile memory cells that can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric random access memory (FeRAM), ferroelectric transitor random-access memory (FeTRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes program erase cycle (PEC) selective sampling component 113 that can be used to support selective sampling of data units in a memory device based on a pattern of error rate change of scanned pages of the data units. In implementations, upon performing a PEC on a data unit of a memory device, PEC selective sampling component 113 can perform a scan operation on a subset of pages of the data unit, in order to reduce the overhead of the scan operation on the performance of the memory device. In certain implementations, the subset of pages can be determined based on the location of the pages within the data unit, such that pages that are located at uniform intervals within the data unit can be selected for scanning. In an illustrative example, for scanning during a particular PEC, PEC selective sampling component 113 can select page0 (e.g., the first page located at the first wordline of the data unit) and then select every third page in the data unit, starting at page0 and ending at the last page in the data unit. In this case, the scan sample can be reduced to approximately 33% of the total number of pages in the data unit, thus improving the performance of the memory device due to reduced overhead introduced by the scan operation.

Further, during the next PEC of the data unit, PEC selective sampling component 113 can select another subset of pages of the data unit for scanning. In this case, PEC selective sampling component 113 can start the page selection process from an offset from page0 (e.g., page1), such that a different subset of pages can be scanned during the second PEC. For example, PEC selective sampling component 113 can select page1 and then select every third page in the data unit, starting at page1 and ending at the last page in the data unit. PEC selective sampling component 113 can then scan the selected pages for defects. In implementations, PEC selective sampling component 113 can continue to shift the starting page with each PEC until all pages of the data units are scanned. When all pages of the data unit are scanned, PEC selective sampling component 113, during the next PEC, can reset the offset to zero and start the selection process for the subset of pages to be scanned at page0, and so on.

When a subset of the pages of the data unit are scanned (i.e., by performing read operations on the subset of pages), PEC selective sampling component 113 can determine a reliability metric based on the read operations, as an indicator of the health of the scanned pages. One example of a reliability metric is a raw bit error rate (RBER). The RBER can be defined as the ratio of the number of erroneous bits to the number of all data bits stored in a data unit of the memory sub-system 110. In one implementation, PEC selective sampling component 113 can determine an average RBER corresponding to the scanned set of pages at a particular PEC (e.g., by calculating the average of RBER values determined at each page within the set of pages). In implementations, PEC selective sampling component 113 can store the average RBER value determined at each PEC performed on the data unit in order to track a pattern of change of the average RBER of the data unit over time. The PEC selective sampling component 113 can then make a determination related to the health of the data unit based on the pattern of change of the RBER of the data unit. In certain implementations, the pattern of change of the RBER of a data unit can be determined by calculating the slope of a graph representing average RBER values versus program/erase cycles of a certain data unit.

In certain implementations, PEC selective sampling component 113 can recognize a certain pattern of change of the RBER as an indication of the existence of one or more defects in a data unit. For example, based on historical data that is collected from scanning one or more data units over time, PEC selective sampling component 113 can recognize a certain pattern of RBER change as a pattern of a defective data unit. This predetermined pattern of RBER change that is indicative of a defective data unit can then be used to determine if a certain data unit is approaching an occurrence of one or more failure modes. In this case, after scanning a set of pages during a PEC of a data unit and determining an average RBER of the PEC, PEC selective sampling component 113 can determine a pattern of RBER change based on the current average RBER and a previously determined RBER of the data unit. PEC selective sampling component 113 can then compare the pattern of change of the RBER with the predetermined pattern of RBER change that is indicative of a defective data unit. If the two patterns are similar to each other (e.g., match), PEC selective sampling component 113 can determine that the data unit is likely to have one or more defects and can perform one or more actions to protect host data stored at the data unit before a failure of the data unit occur.

In certain implementations, when PEC selective sampling component 113 determines that the pattern of RBER change of the data unit is similar to the predetermined pattern of RBER change that is indicative of a defect, PEC selective sampling component 113 can retire the data unit. Retiring the data unit refers to moving the data stored at the data unit to another data unit of memory sub-system 110, and marking the data unit such that it can no longer be used for storing host data. Because the data unit is retired, when the defect causing the pattern of high RBER is detected, e.g., by causing loss of data stored at the data unit, any impact of the defect is minimized because host data is not stored at the data unit. In other implementations, upon determining that the two patterns are similar, PEC selective sampling component 113 can decide to monitor the data unit more closely for other indications of defects, instead of retiring the data unit. For example, PEC selective sampling component 113 can increase the number of pages scanned with each PEC (e.g., selecting every other page in the data unit instead of every third page for scanning). Increasing the number of scanned pages can result in a more accurate RBER per PEC due to the bigger scanned sample. In this case, PEC selective sampling component 113 can continue to store the average RBER per PEC and can continue to compare the pattern of RBER change to determine if the pattern of RBER change continues to correspond to the predetermined pattern of RBER change of a defective data unit.

On the other hand, when PEC selective sampling component 113 determines that the pattern of RBER change of the data unit does not correspond to the predetermined pattern of RBER change that is indicative of a defect, PEC selective sampling component 113 can store the current average RBER at a storage location so that it can be used in determining a pattern of RBER change over time. In certain implementations, PEC selective sampling component 113 can also release parity data associated with the set of pages that were scanned to generate the current average RBER. Parity data can support a redundancy mechanism implemented by memory sub-system 110 to protect the host data against a failure of a portion of a memory device that is storing the host data. For example, for a negative-and (NAND) type flash memory device, memory sub-system 110 can implement a redundant array of independent NAND (RAIN) operation to provide redundancy for the data stored on memory sub-system 110. For example, memory sub-system 110 can generate parity data when writing data received from the host system to memory sub-system 110. The memory sub-system can generate the parity data based on an exclusive-or (XOR) operation with the received host data and use the parity data to reconstruct or recalculate the host data in the event of a failure of the portion of the memory device that is storing data from the host system. As an example, memory sub-system 110 can calculate parity data for a particular number of host data pages of a data unit of memory sub-system 110. The parity data can be generated based on an XOR operation among each of the host data stored on the particular number of pages. The parity data can then be stored at a data storage location dedicated for parity data. If a portion of a memory device storing one of the host data fails and the corresponding data is lost or corrupt, then memory sub-system 110 can reconstruct the lost/corrupt data based on an XOR operation among the rest of the host data and the parity data. In implementations, when a set of pages of the memory device are deemed not defective (e.g., by scanning the set of pages and determining that RBER of the pages is within acceptable limits), the memory sub-system can release the parity data associated with the set of pages, thus freeing space in the parity data storage location for new parity data of other data units.

Figure 2:
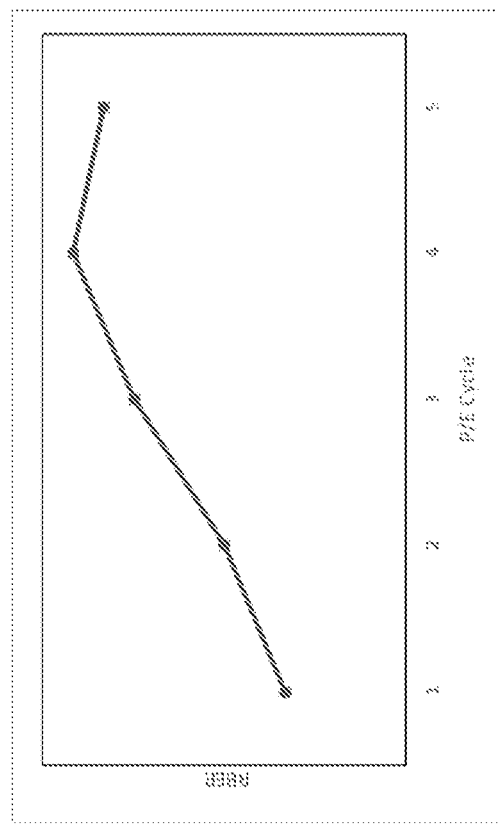
FIG. 2 illustrates RBER change patterns that can be tracked over multiple program erase cycles (PEC)s of a data unit in order to determine a likelihood of a defect in the data unit, in accordance with some embodiments of the present disclosure.
Figure 2:
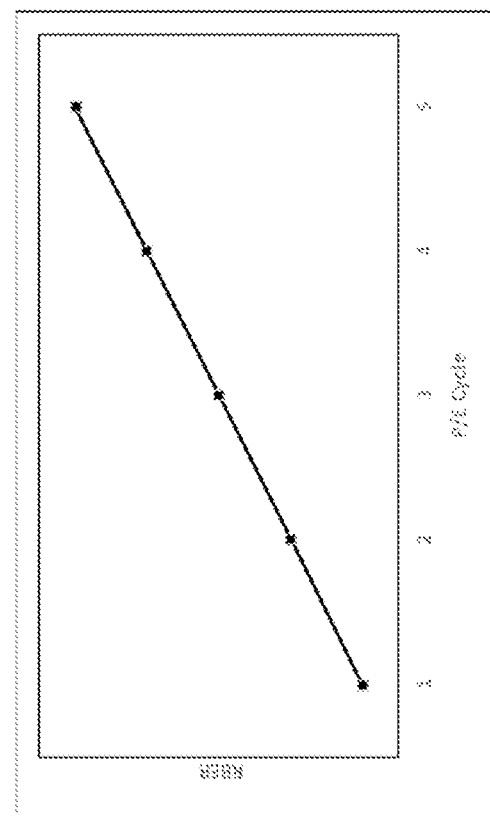

FIG. 2 illustrates RBER change patterns that can be tracked over multiple program erase cycles (PEC)s of a data unit in order to determine a likelihood of a defect in the data unit, in accordance with some embodiments of the present disclosure. In one implementation, RBER change pattern graph 210 represents a pattern of RBER change for one or more defective data units. As an example, memory sub-system 110 of FIG. 1 can generate RBER change pattern graph 210 based on historical data of performing scan operations on defective data units and determining an average RBER per PEC performed on the defective data units. In implementations, a significant increase in RBER with each PEC scan can be an indicator of a pattern of RBER change that is indicative of a defect. Memory sub-system 110 can then store the RBER values of RBER change pattern graph 210 so that it can be used for comparison with other RBER change patterns of healthy data units.

RBER change pattern graph 220 represents a pattern of RBER change for a data unit. In implementations, memory sub-system 110 can generate RBER change pattern graph 220 of the data unit by determining an average RBER value of the data unit when performing program erase cycles (PEC) on the data unit, and then storing the average RBER value at a storage location. Memory sub-system 110 can determine an RBER value by scanning a subset of pages of the data unit at each PEC cycle. As each PEC is performed, memory sub-system 110 can scan a different subset of the pages of the data unit, as explained in more details herein in FIG. 3.

In implementations, when memory sub-system 110 performs a scan of a subset of the pages of the data unit during a PEC and determines an average RBER corresponding to the PEC, memory sub-system 110 can update RBER change pattern graph 220 with the average RBER. Memory sub-system 110 can then compare RBER change pattern graph 220 with RBER change pattern graph 210, in order to determine whether or not the data unit is likely to have a defect. As an example, memory sub-system 110 can compare the two graphs by calculating and then comparing a slope of each graph. When memory sub-system 110 determines that RBER change pattern graph 210 is similar to RBER change pattern graph 220. Memory sub-system 110 can determine that the data unit is likely to have a defect and can perform actions to protect the host data stored at the data unit.

In certain implementations, memory sub-system 110 determines that RBER change pattern graph 210 is similar to RBER change pattern graph 220, thereby memory sub-system 110 can retire the data unit associated with RBER change pattern graph 220, such that the data unit can no longer be used for storing host data and the data currently stored in the data unit can be moved to another data unit before any failure of the data unit can occur. In other implementations, upon determining that the two graphs corresponds to each other, memory sub-system 110 can decide to monitor the data unit associated with RBER change pattern graph 220 more closely, instead of retiring the data unit. For example, memory sub-system 110 can increase the number of pages scanned with each PEC (e.g., by selecting every other page in the data unit instead of every third page for scanning), in order to generate a more accurate average RBER per PEC. In this case, memory sub-system 110 can continue to store the average RBER per PEC and can continue to compare RBER change pattern graph 220 with RBER change pattern graph 210 to determine if the graphs continue to match after increasing the accuracy of the average RBER per PEC. In other examples, memory sub-system 110 can monitor the data unit by collecting other reliability metrics when the graphs match (for example, by comparing program times of the pages of the data unit to an acceptable range of program times). In this case, memory sub-system 110 can make a determination on the health of the data unit based on multiple reliability indicators instead of relying only on the RBER change pattern.

On the other hand, when memory sub-system 110 determines that RBER change pattern graph 220 does not match RBER change pattern graph 210 (e.g., by determining that the slope of RBER change pattern graph 220 is significantly different from the slope of RBER change pattern graph 210), memory sub-system 110 can store the current average RBER at a storage location so that it can be used in determining a pattern of RBER change over time. In certain implementations, memory sub-system 110 can also release parity data associated with the scanned subset of pages of the data unit because the scanned pages are determined to be free of defects (based on the comparison results of the two graphs), as explained in more details herein.

Figure 3:
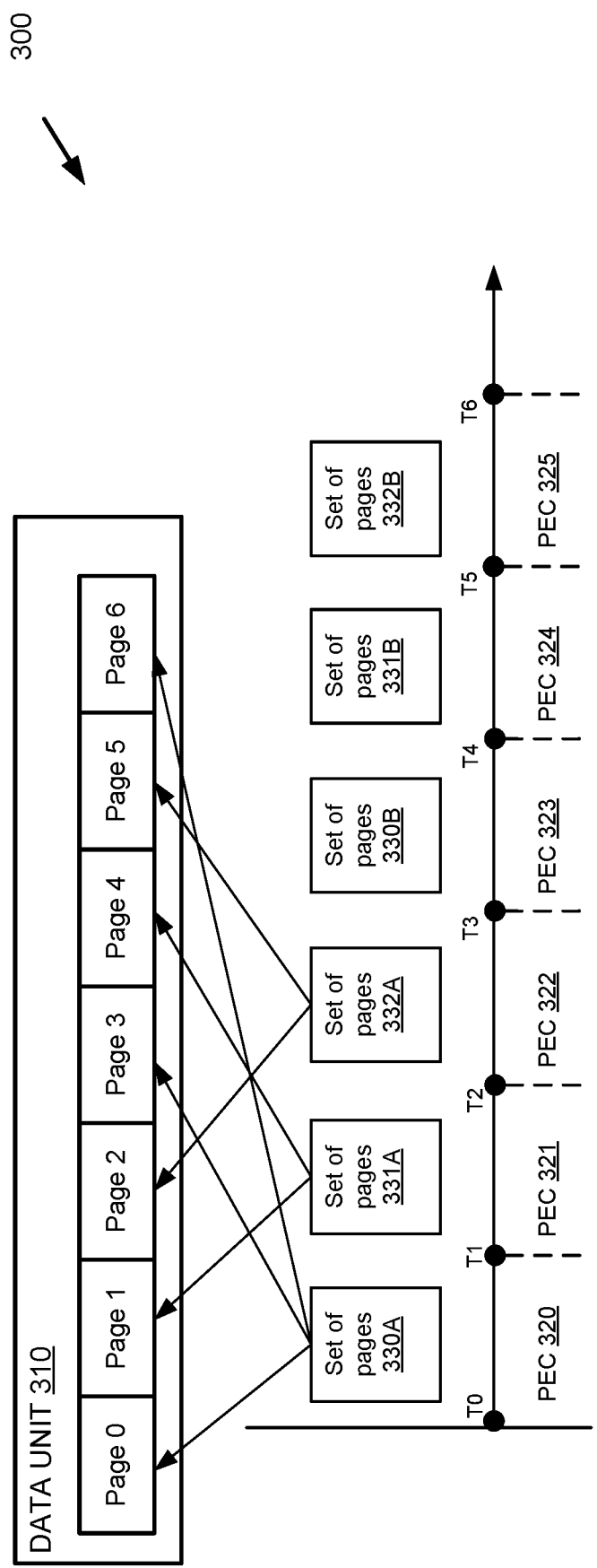
FIG. 3 illustrates a block diagram if assigning pages of a data unit to multiple sets of pages for scanning during program erase cycles (PEC) to support selective sampling in PECs, in accordance with some embodiments of the present disclosure.

FIG. 3 illustrates a block diagram if assigning pages of a data unit to multiple sets of pages for scanning during program erase cycles (PEC) to support selective sampling in PECs, in accordance with some embodiments of the present disclosure. In certain implementations, memory sub-system 110 can perform a scan operation of data unit 310 with each PEC 320-325 performed on data unit 310. Memory sub-system 110 can scan a subset of pages 0-6 of data unit 310 with each PEC, in order to minimize the performance impact on memory sub-system 110 of running scan operations. In an illustrative example, memory sub-system 110 can scan one of sets of pages 330-332 with each PEC 320-325, track RBER for each scanned set of pages 330-332, and use a pattern of RBER change over time to determine a likelihood of an existence of a defect at data unit 310.

At time T0, memory sub-system 110 can perform PEC 320 on data unit 310. Upon performing PEC 320, memory sub-system 110 can also perform a scan operation on set of pages 330A. Memory sub-system 110 can determine to include every third page of data unit 310 in set of pages 330A, starting at page 0, thus including page 0, page 3, and page 6 in set of pages 330A. Memory sub-system 110 can then determine an average RBER based on scanning set of pages 330A and can store the average RBER as corresponding to PEC 320. At time T1, memory sub-system 110 can perform PEC 321 on data unit 310, which includes performing a scan operation on set of pages 331A. Similar to the determination with respect to set of pages 330A, memory sub-system 110 can determine to include every third page of data unit 310 in set of pages 331A, but the starting page can be shifted by an offset from the starting page for PEC 320, in order to select a different set of pages for scanning during PEC 321. As an example, the offset can be 1 and the starting page to be included in set of pages 331A can be page 1. Therefore, set of pages 331A can include page 1 and page 4. Memory sub-system 110 can then determine an average RBER based on scanning set of pages 331A and can store the average RBER as corresponding to PEC 321.

At T2, memory sub-system 110 can perform PEC 322 on data unit 310, which includes performing a scan operation on set of pages 332A. Similar to the determinations with respect to set of pages 330A and set of pages 331A, memory sub-system 110 can determine to include every third page of data unit 310 in set of pages 332A, and the starting page can be shifted by an offset from the starting page for PEC 321, in order to select a different set of pages for scanning during PEC 322 than the page that were scanned during PEC 320 and PEC 321. As an example, the offset can be incremented to 2 and the starting page to be included in set of pages 332A can be page 2. Therefore, set of pages 332A can include page 2 and page 5. Memory sub-system 110 can then determine an average RBER based on scanning set of pages 332A and can store the average RBER as corresponding to PEC 322.

At T3, memory sub-system 110 can perform PEC 323 on data unit 310. At this point, memory sub-system 110 can detect that all pages of data unit 310 have been scanned during PECs 320-322. Memory sub-system 110 can then reset the offset for determining the starting page back to zero, and can include every third page of data unit 310 in set of pages 330B, starting from page 0. Therefore, set of pages 330B can include page 0, page 3, and page 6. Memory sub-system 110 can then perform a scan operation on set of pages 330B, determine an average RBER based on scanning set of pages 330B, and can store the average RBER as corresponding to PEC 323.

At T4, memory sub-system 110 can perform PEC 324 on data unit 310, which includes performing a scan operation on set of pages 331B. Similar to the determinations with respect to the previous sets of pages, memory sub-system 110 can determine to include every third page of data unit 310 in set of pages 331B, starting at page 1, which comprise the same set of pages that were included in set of pages 331A. Therefore, set of pages 331B can include page 1 and page 4. Memory sub-system 110 can then determine an average RBER based on scanning set of pages 331B and can store the average RBER as corresponding to PEC 324. At T5, memory sub-system 110 can perform PEC 325 on data unit 310, which includes performing a scan operation on set of pages 332B. Similar to the determinations with respect to the previous sets of pages, memory sub-system 110 can determine to include every third page of data unit 310 in set of pages 332B, starting at page 2 after incrementing the offset to 2, which comprise the same set of pages that were included in set of pages 332A. Therefore, set of pages 332B can include page 2 and page 5. Memory sub-system 110 can then determine an average RBER based on scanning set of pages 332B and can store the average RBER as corresponding to PEC 325. Memory sub-system 110 can continue to scan a subset of pages during performing program erase cycles and continue tracking RBER values corresponding to PECs to monitor the health of data unit 310.

Figure 4:
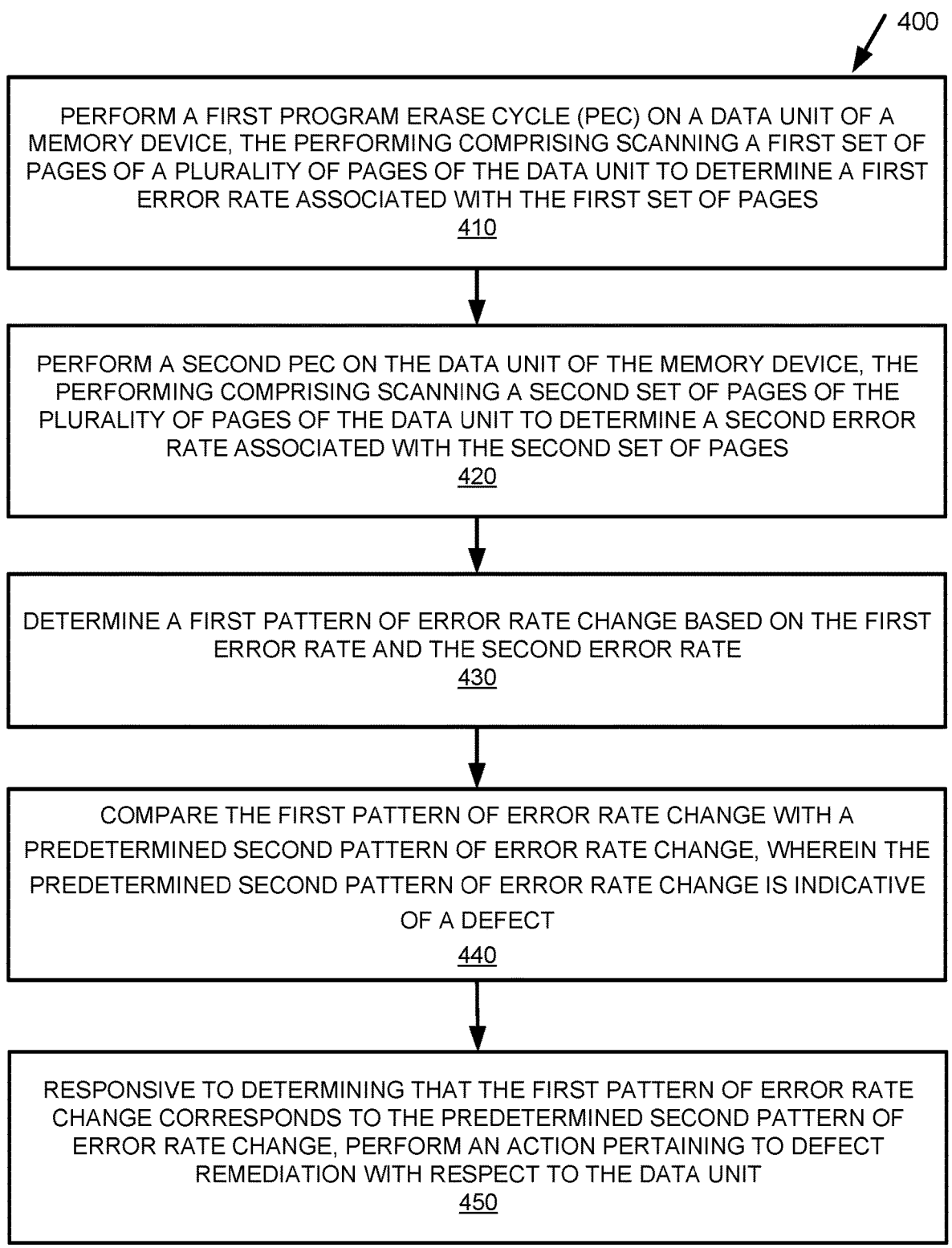
FIG. 4 is a flow diagram of an example method of supporting selective sampling of a data unit during a program erase cycle based on error rate change patterns in a memory sub-system, in accordance with some embodiments of the present disclosure.

FIG. 4 is a flow diagram of an example method of supporting selective sampling of a data unit during a program erase cycle based on error rate change patterns in a memory sub-system, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by program erase cycle selective sampling component 113 of FIG. 1.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic performs a program erase cycle (PEC) on a data unit of a memory device. When performing a PEC, the processing logic also scans a set of pages of the data unit to determine an error rate associated with the set of pages. In implementations, the set of pages can be determined based on the location of the pages within the data unit, such that pages that are located at uniform intervals within the data unit can be selected for scanning, as explained in details herein. The error rate can be an average raw bit error rate (RBER) corresponding to the scanned set of pages.

At operation 420, the processing logic performs another PEC on the data unit and scans another set of pages of the data unit to determine a second error rate (e.g., a second average RBER) associated with the other set of pages. In implementations, the other set of pages can also be determined based on the location of the pages within the data unit after shifting the starting page by an offset from the starting page for selecting the first set of pages. In this case, pages that are located at the uniform intervals within the data unit, starting from the page at the offset, can be selected for scanning.

At operation 430, the processing device determines a pattern of error rate change based on the first average RBER and the second average RBER. In certain implementations, the pattern of change of the RBER of a data unit can be determined by calculating the slope of a graph representing average RBER values versus PECs of the data unit, as explained in more details herein above.

At operation 440, the processing device compares the pattern of error rate change with a predetermined pattern of error rate change corresponding to pattern of RBER change of a defective data unit. Based on the comparison, the processing device can then determine whether the data unit is likely to have a defect, as explained in more details herein.

At operation 450, when the processing device determines that the pattern of error rate change corresponds to the predetermined pattern of error rate change, the processing device can perform one or more actions action pertaining to defect remediation with respect to the data unit (e.g., retiring the data unit, scanning the data unit at a higher rate, etc.), as explained in more details herein.

Figure 5:
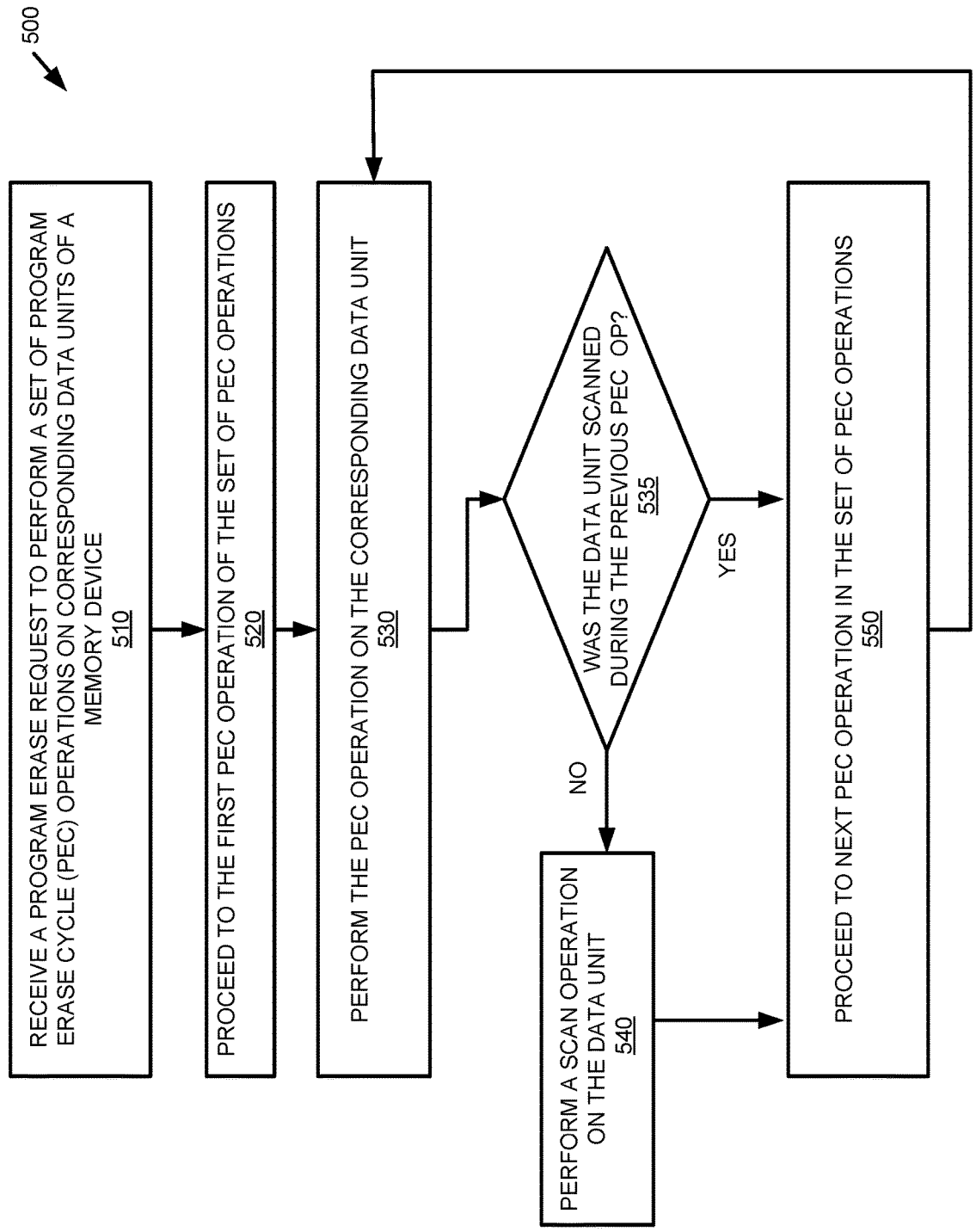
FIG. 5 is a flow diagram of an example method of selective sampling of data units during program erase cycles (PEC)s of a memory sub-system, in accordance with some embodiments of the present disclosure.

FIG. 5 is a flow diagram of an example method of selective sampling of data units during program erase cycles (PEC)s of a memory sub-system, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by program erase cycle selective sampling component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic receives a request to perform a set of PEC operations on corresponding data units of a memory device, such that each PEC operation is performed on a corresponding data unit. In implementations, the set of PEC operations can be requested by the memory sub-system controller in order to perform an internal operation of the memory sub-system such as a wear leveling operation, a garbage collection operation, etc.

At operation 520, the processing logic loops through the set of PEC operations starting at the first PEC operation. At operation 530, the processing logic performs the PEC on the corresponding data unit. The processing logic, at operation 535, can then determine whether the data unit was scanned during the most recent PEC that was previously performed on the data unit. In implementations, the processing logic can determine that data units can be scanned less frequently to improve the performance of the memory device. As an example, the processing logic can determine to scan each data unit during every other PEC operation instead of scanning each data unit during each PEC operation.

At operation 550, when the processing logic determines that the data unit was scanned during the previous PEC operation (e.g., by inspecting a flag associated with the data unit indicating whether the data unit was scanned during the previous PEC operation), the processing logic can determine to proceed to performing the next PEC operation without scanning the data unit. The processing logic can then proceed to operation 530 for performing the next PEC operation of the set of PEC operations.

On the other hand, when the processing logic determines that the data unit was not scanned during the previous PEC operation, the processing logic can perform a scan operation on the data unit, at operation 540. In certain implementations, the processing logic can perform the scan operation on a subset of the pages of the data unit. In other implementations, the processing logic can perform the scan operation on all pages of the data unit. The processing logic can then proceed to process the next PEC operation of the set of PEC operations.

Figure 6:
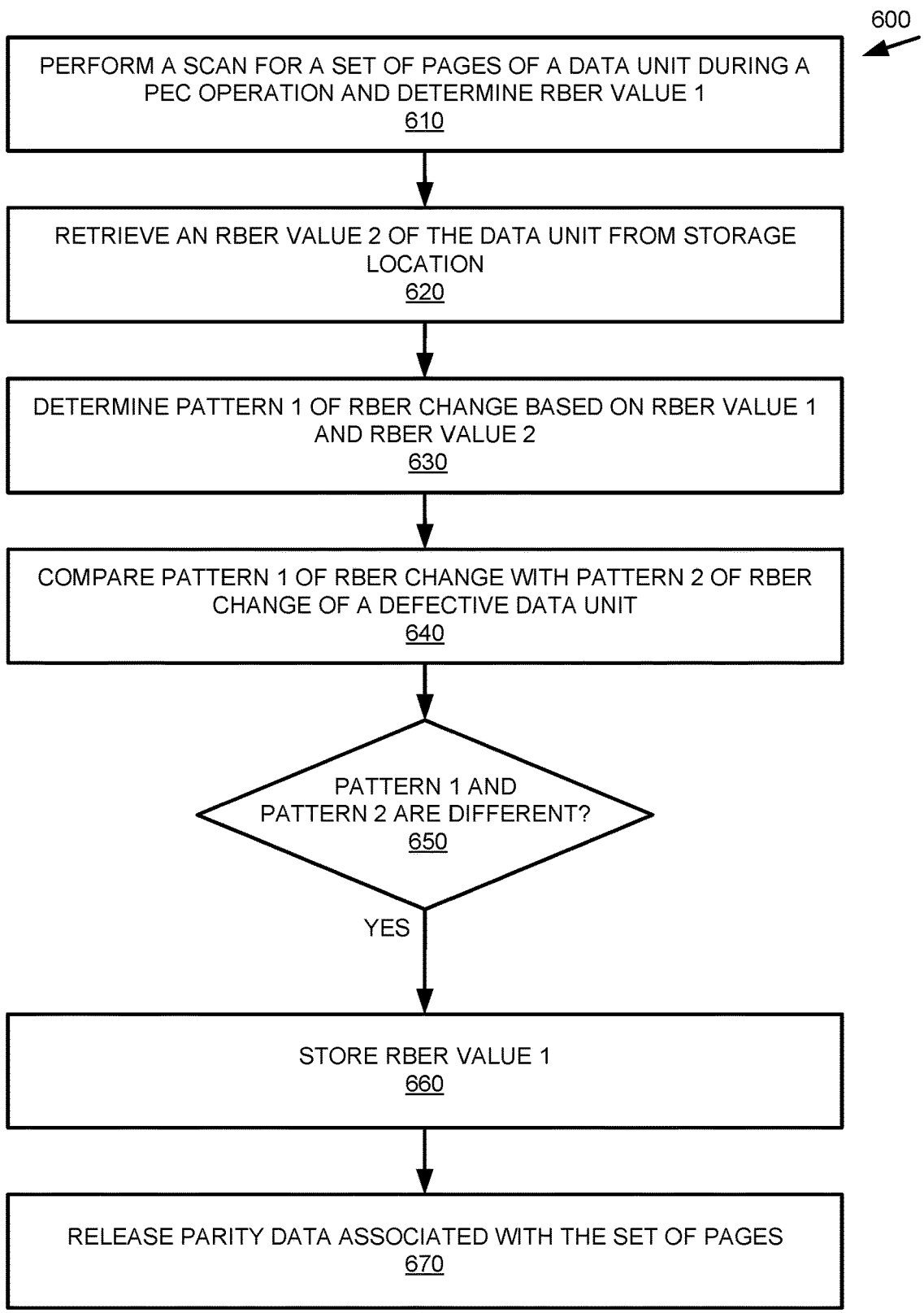
FIG. 6 is a flow diagram of another example method of selective sampling of a data unit during a program erase cycle (PEC) by tracking RBER values of the data unit, in accordance with some embodiments of the present disclosure.

FIG. 6 is a flow diagram of another example method of selective sampling of a data unit during a program erase cycle (PEC) by tracking RBER values of the data unit, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by program erase cycle selective sampling component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic performs a scan operation for a set of pages of a data unit during a PEC operation of the data unit. The processing logic then determines an average RBER value 1 of the scanned set of pages, as explained in more details herein above. In order to determine a pattern of RBER change of the data unit over time, the processing logic at operation 620 retrieves, from a storage location, RBER value 2 associated with the data unit. In implementations, RBER value 2 was previously stored at the storage location upon a previous scan operation of the data unit.

At operation 630, the processing device determines pattern 1 of RBER change based on RBER value 1 and RBER value 2. In certain implementations, pattern 1 of RBER change can indicate whether the data unit is likely to be defective by comparing pattern 1 to another pattern of RBER change that is indicative of a high likelihood of one or more defects, as explained in more details herein above.

At operation 640, the processing device compares pattern 1 of RBER change with pattern 2 of RBER change of a defective data unit. Based on the comparison, the processing device can then determine whether the data unit is healthy or is likely to have a defect, as explained in more details herein. Therefore, at operation 650, the processing device determines whether pattern 1 and pattern 2 are different. In implementations, the processing logic can determine that the two patterns are different if the two patterns do not match and are not within one standard deviation from each other.

At operation 660, the processing logic determines that the two patterns are different. The processing logic then can determine that the data unit is not likely to have a defect and can continue to scan the data unit at PEC operations in order to continue tracking the RBER change for the data unit. Therefore, the processing logic stores RBER value 1 at the storage location so that it can be used in determining the pattern of RBER changes in subsequent PEC operations.

At operation 670, based on the determination that the data unit is not likely to be defective, the processing logic can release parity data associated with the set of pages that were scanned. Parity data can be stored temporarily to be used to recover data stored at one or more pages of the data unit if a defect causes data loss of the one or more pages. In implementations, when a set of pages of a data unit are deemed not defective (e.g., based on the results of a scan operation), the processing logic can release the parity data associated with the set of pages, thus freeing space in the parity data storage location for new parity data of other data units.

Figure 7:
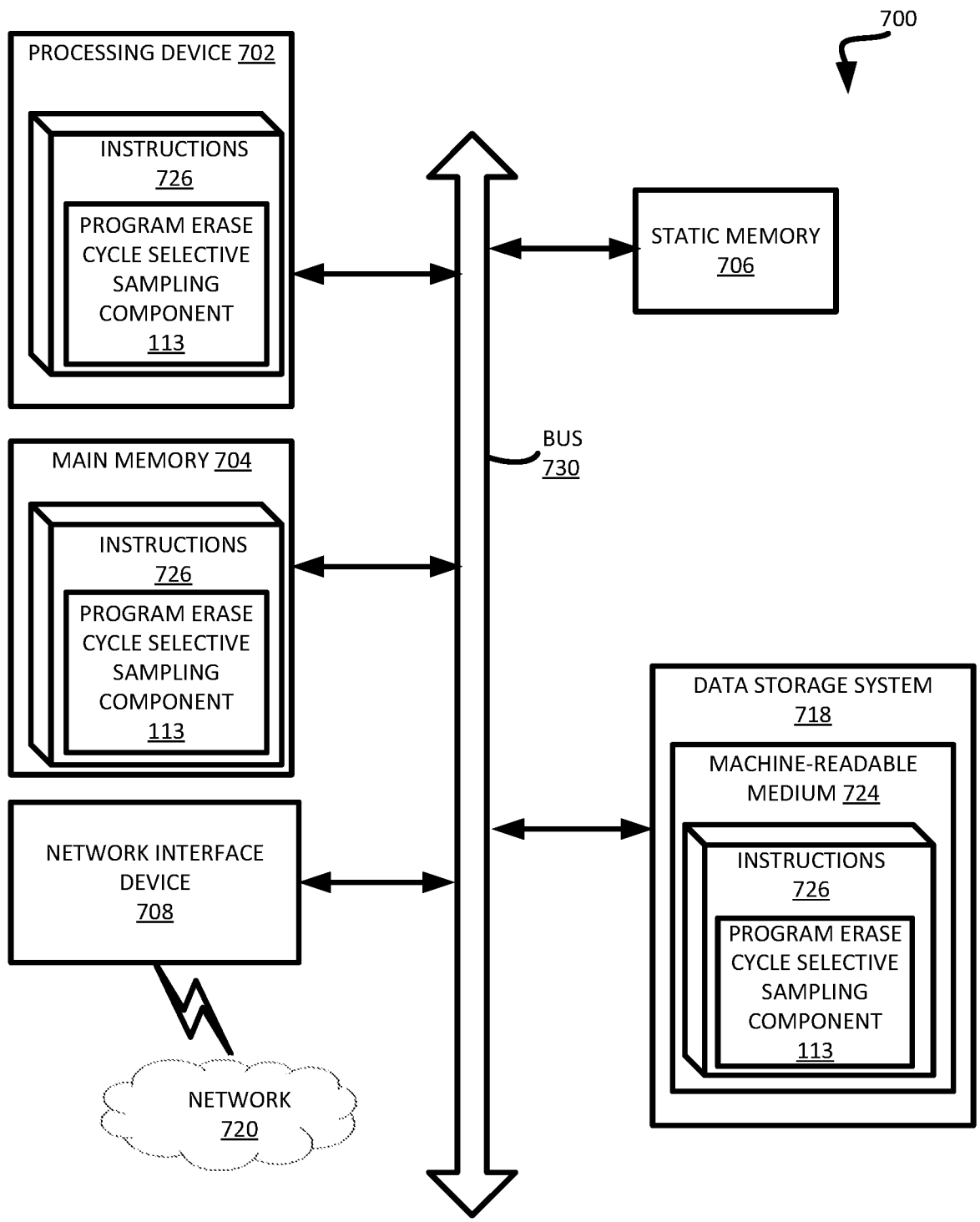
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to program erase cycle selective sampling component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to program erase cycle selective sampling component 113 of FIG. 1. While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   determining a first error rate associated a first set of pages of a plurality of pages of a data unit of a memory device, and a second error rate associated with a second set of pages of the plurality of pages of the data unit;
   determining a first pattern of error rate change for the data unit based on the first error rate and the second error rate; and
   responsive to determining that the first pattern of error rate change corresponds to a predetermined second pattern of error rate change, performing an action pertaining to defect remediation with respect to the data unit.

2. The method of claim 1, wherein the first set of pages comprises a subset of pages located at uniform intervals within the data unit starting at a first location.

3. The method of claim 2, wherein the second set of pages comprise a second subset of pages located at the uniform intervals starting at a second location, wherein the second location is shifted by an offset from the first location.

4. The method of claim 3 further comprising:
   updating, based on the first pattern of error rate change, the uniform intervals used for locating pages of the first set of pages and the second set of pages of the data unit.

5. The method of claim 1, wherein the predetermined second pattern of error rate change is derived from historical data associated with one or more data units having one or more defects.

6. The method of claim 1, wherein the action pertaining to defect remediation comprises at least one of retiring the data unit or scanning the data unit at a higher rate than the rate of scanning other data units of the memory device.

7. The method of claim 1 further comprising:
   receiving a program erase request at the memory device to perform a plurality of program erase cycles on a plurality of corresponding data units; and
   upon performing the plurality of the program erase cycles on the plurality of corresponding data units, scanning a subset of the plurality of corresponding data units, wherein the subset is determined based on a predetermined criterion.

8. The method of claim 1 further comprising:
   responsive to determining that the first pattern of error rate change does not correspond to the predetermined second pattern of error rate change:
   storing the first error rate and the second error rate at a storage location; and
   releasing a first set of parity data associated with the first set of pages and a second set of parity data associated with the second set of pages.

9. The method of claim 1, wherein determining the first pattern of error rate change further comprises:
   retrieving, from a storage location, a third error rate associated with a third set of pages of the plurality of pages of the data unit; and
   determining the first pattern of error rate change based on the first error rate, the second error rate, and the third error rate.

10. A system comprising:
    a memory device; and
    a processing device, operatively coupled with the memory device, to perform operations comprising:
    determining a first error rate associated a first set of pages of a plurality of pages of a data unit of a memory device, and a second error rate associated with a second set of pages of the plurality of pages of the data unit;

determining a first pattern of error rate change for the data unit based on the first error rate and the second error rate; and responsive to determining that the first pattern of error rate change corresponds to a predetermined second pattern of error rate change, performing an action pertaining to defect remediation with respect to the data unit.

11. The system of claim 10, wherein the first set of pages comprises a subset of pages located at uniform intervals within the data unit starting at a first location.

12. The system of claim 11, wherein the second set of pages comprise a second subset of pages located at the uniform intervals starting at a second location, wherein the second location is shifted by an offset from the first location.

13. The system of claim 12, the operations further comprising:

updating, based on the first pattern of error rate change, the uniform intervals used for locating pages of the first set of pages and the second set of pages of the data unit.

14. The system of claim 10, wherein the predetermined second pattern of error rate change is derived from historical data associated with one or more data units having one or more defects.

15. The system of claim 10, wherein the action pertaining to defect remediation comprises at least one of retiring the data unit or scanning the data unit at a higher rate than the rate of scanning other data units of the memory device.

16. The system of claim 10, the operations further comprising:

receiving a program erase request at the memory device to perform a plurality of program erase cycles on a plurality of corresponding data units; and upon performing the plurality of the program erase cycles on the plurality of corresponding data units, scanning a subset of the plurality of corresponding data units, wherein the subset is determined based on a predetermined criterion.

17. The system of claim 10, the operations further comprising:

responsive to determining that the first pattern of error rate change does not correspond to the predetermined second pattern of error rate change:

storing the first error rate and the second error rate at a storage location; and releasing a first set of parity data associated with the first set of pages and a second set of parity data associated with the second set of pages.

18. The system of claim 10, wherein determining the first pattern of error rate change further comprises:

retrieving, from a storage location, a third error rate associated with a third set of pages of the plurality of pages of the data unit; and determining the first pattern of error rate change based on the first error rate, the second error rate, and the third error rate.

19. A non-transitory computer-readable storage medium comprising instructions that, when executed by a processing device, cause the processing device to perform operations comprising:

determining a first error rate associated a first set of pages of a plurality of pages of a data unit of a memory device, and a second error rate associated with a second set of pages of the plurality of pages of the data unit;

determining a first pattern of error rate change for the data unit based on the first error rate and the second error rate; and responsive to determining that the first pattern of error rate change corresponds to a predetermined second pattern of error rate change, performing an action pertaining to defect remediation with respect to the data unit.

20. The non-transitory computer-readable storage medium of claim 19, wherein the predetermined second pattern of error rate change is derived from historical data associated with one or more data units having one or more defects.

* * * * *